(12) United States Patent
Neary (10) Patent No.: US 6,288,574 B1
(45) Date of Patent: Sep. 11, 2001

(54) DIGITAL PHASE DETECTOR

(75) Inventor: Michael B. Neary, Manhattan Beach, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/468,709

(22) Filed: Dec. 21, 1999

(51) Int. Cl.[7] .................................................. G01R 25/00
(52) U.S. Cl. .............................. 327/12; 327/48; 327/160
(58) Field of Search .................................... 327/2, 3, 7, 12, 327/47–49, 160

(56) References Cited

U.S. PATENT DOCUMENTS 5,392,347 * 2/1995 Ito et al. ............................... 379/372
5,440,592 * 8/1995 Ellis et al. ............................ 375/354
5,818,265 * 10/1998 Meller et al. ........................... 327/6

* cited by examiner

Primary Examiner—Toan Tran
Assistant Examiner—Cassandra Cox
(74) Attorney, Agent, or Firm—Phil Virga (57) ABSTRACT

A digital phase detector utilizes a digital compartor and a plurality of delay elements. The comparator compares two signals and generates an output signal with a duration corresponding to the time delay between the arrival times of two signals. The output signal propagates through the plurality of delay elements. The number of delay elements that cover the duration of the output signal determine a time value for the duration of the output signal.

5 Claims, 6 Drawing Sheets

DIGITAL PHASE DETECTOR

This application is related to U.S. patent application Ser. No. 09/468,708 "Reference Frequency and Facet to Facet Error Correction Circuit" (Common Assignee) filed concurrently herewith.

BACKGROUND OF THE INVENTION

This invention relates to phase detectors and, more particularly, to a digital phase detector which receives two signals and generates a numerical value based on the time difference between the arrival times of the two signals.

Figure 1:
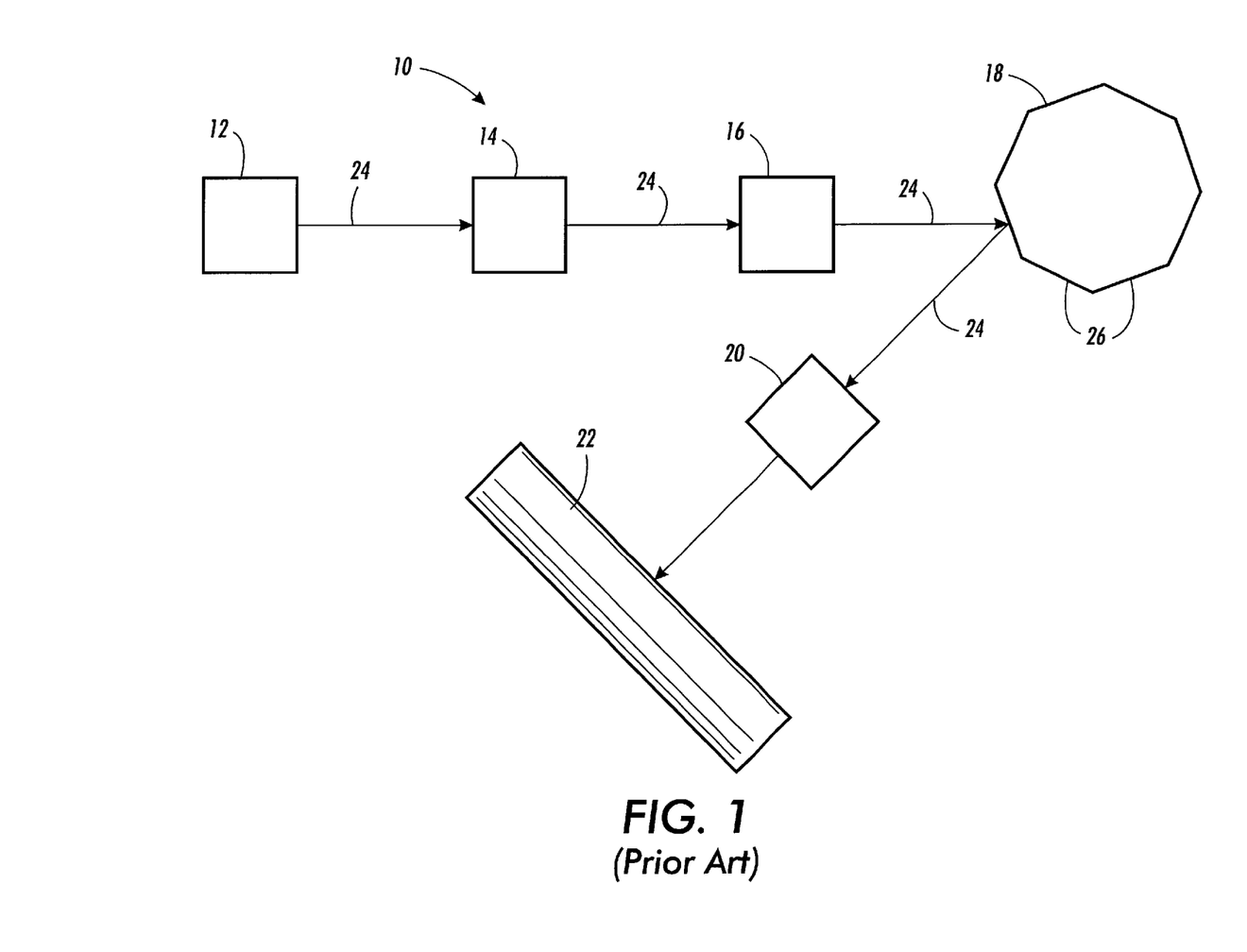
FIG. 1 shows a tangential (fast-scan) view of a prior art raster output scanner of a printing system.

Referring to FIG. 1, there is shown a tangential (fast-scan) view of a prior art raster output scanner 10 of a printing system. The raster scanning system 10 utilizes a laser light source 12, a collimator 14, pre-polygon optics 16, a multi-faceted rotating polygon mirror 18 as the scanning element, post polygon optics 20 and a photosensitive medium 22.

The laser light source 12 sends a light beam 24 to the rotating polygon mirror 18 through the collimator 14 and the pre-polygon optics 16. The collimator 14 collimates the light beam 24 and the pre-polygon optics 16 focuses the light beam 24 in the sagittal or cross-scan plane onto the rotating polygon mirror 18. The facets 26 of the rotating polygon mirror 18 reflect the light beam 24 and cause the reflected light beam 24 to revolve about an axis near the reflection point of the facet 26. The reflected light beam 24 is utilized through the post polygon optics 20 to scan a document at the input of an imaging system or can be used to impinge upon a photographic film or a photosensitive medium 22, such as a xerographic drum at the output of an imaging system. Hereinafter, for the purpose of simplicity the "rotating polygon mirror" will be referred to as "polygon".

In this process, depending on the manufacturing tolerances, each facet might have different characteristics such as a minute width variation which can cause the line scanned by this facet to be scanned faster or slower than average scan time. This type of error is called facet to facet error. In order to correct this problem, it is best to check the error of each facet compared to the average speed of the polygon (average scan time) which is the average speed of all the facets of the polygon.

To find the facet to facet or the reference frequency errors, the time difference between the arrival times of the end of scan and end of count signals of each facet has to be measured. Typically, an analog phase detector is used to measure this time difference. However, analog circuits and analog outputs are not practical in the digital world.

It is an object of this invention to design a digital phase detector which is capable of generating a digital numerical value for the time difference between arrival times of two signals.

SUMMARY OF THE INVENTION

According to the present invention, a digital delay determining apparatus utilizes a comparing means, a delaying means, and a delay determining means. The comparing means receives a first and a second signal and generates an output signal with a duration based on the time difference between the arrival times of the first and second signals. The delaying means has a plurality of delay stages and is electrically connected to the comparing means for receiving the output signal from the comparing means and passing it through its plurality of delay stages. The delay determining means is electrically connected to the delaying means for determining the number of delay stages that cover the duration of the output signal from the comparing means.

DESCRIPTION OF THE PREFERRED EMBODIMENT

Figure 2:
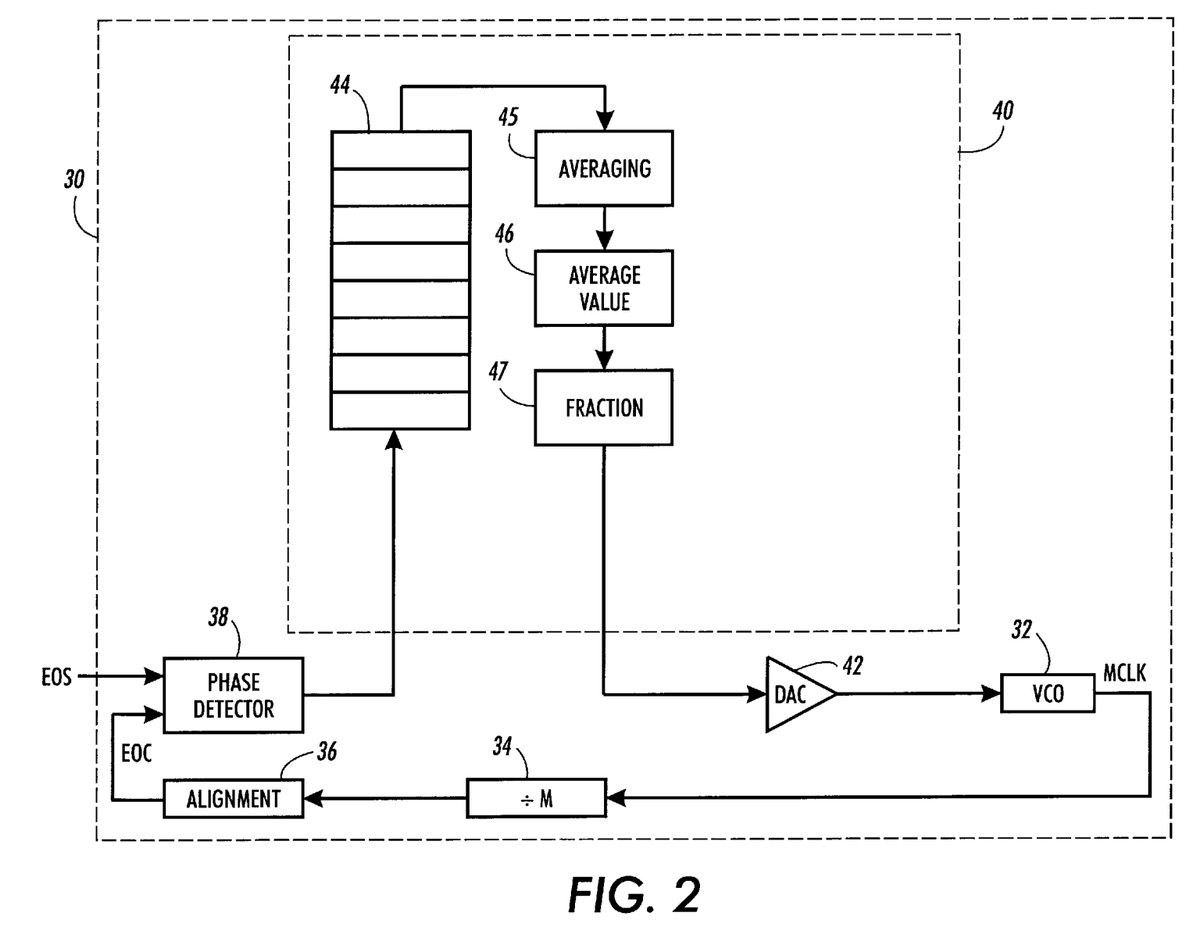
FIG. 2 shows a block diagram of a phase locked loop of this invention which is designed to continuously correct the reference frequency error.

Referring to FIG. 2, there is shown a block diagram of a phase locked loop circuit 30 of this invention which is designed to continuously correct the reference frequency error. In FIG. 2, a voltage controlled oscillator (VCO) 32, a divider 34, an alignment logic 36, a digital phase detector 38, a microprocessor 40 and a digital to analog converter (DAC) 42 are utilized to generate an accurate main clock Mclk. The main clock Mclk will be synchronized with the start of scan (SOS) to generate the pixel clock (Pclk).

Typically, a raster output scanner (ROS) system has two sensors to detect the start of scan (SOS) and the end of scan (EOS). As the scanning laser light beam passes over a dedicated spot on the scan line immediately prior to pixel placement, the respective sensor generates a start of scan SOS. In the same manner, as the scanning laser light beam passes over a dedicated spot on the scan line immediately after the end of pixel placement, the respective sensor generates an end of scan EOS. The SOS and the EOS are being generated for each scan line.

Within the phase locked loop 30, the voltage controlled oscillator VCO (clock generator) 32 generates a main clock Mclk and sends it to divider 34 which divides the Mclk by M to serially generate a plurality of end of count (EOC) pulses which are sent out as the EOC signal. Each one of the plurality of EOC pulses corresponds to one of the plurality of facets of the rotating polygon mirror. M is the total number of pixels per scan line. For example, for a 14.4 inch paper with 600 pixels per inch, M is 8640. The EOC, which indicates the end of pixel information, is sent to a phase detector 38 through alignment block 36. The alignment block 36 aligns the EOC for any movement of the photoreceptor belt in the scan direction.

The phase detector 38 receives the internally generated EOC signal and an EOS signal from the ROS system. EOS signal is a plurality of serially sent end of scan pulses where each pulse corresponds to one of the plurality of the facets of the rotating polygon mirror.

The EOS and EOC pulses of each facet should arrive to the phase detector 38 at the same time. However, for various reasons such as characteristics of different facets, EOS pulse night arrive to the phase detector 38 before or after the EOC pulse. For the purpose of simplicity, hereinafter, the EOS pulse and EOC pulse are referred to as EOS and EOC respectively.

For each facet, the phase detector 38 compares and measures the time difference between the EOS and EOC and sends out a digital time value for the delay between the two signals. The time difference (digital time value) between the EOS and EOC of each facet is sent to a lookup table 44. The lookup table 44 has an individual addressable location for the time difference of each facet. The phase detector 38 continuously measures the time difference between the EOC and EOS of each facet and refreshes the time difference stored in the lookup table 44.

Figure 3:
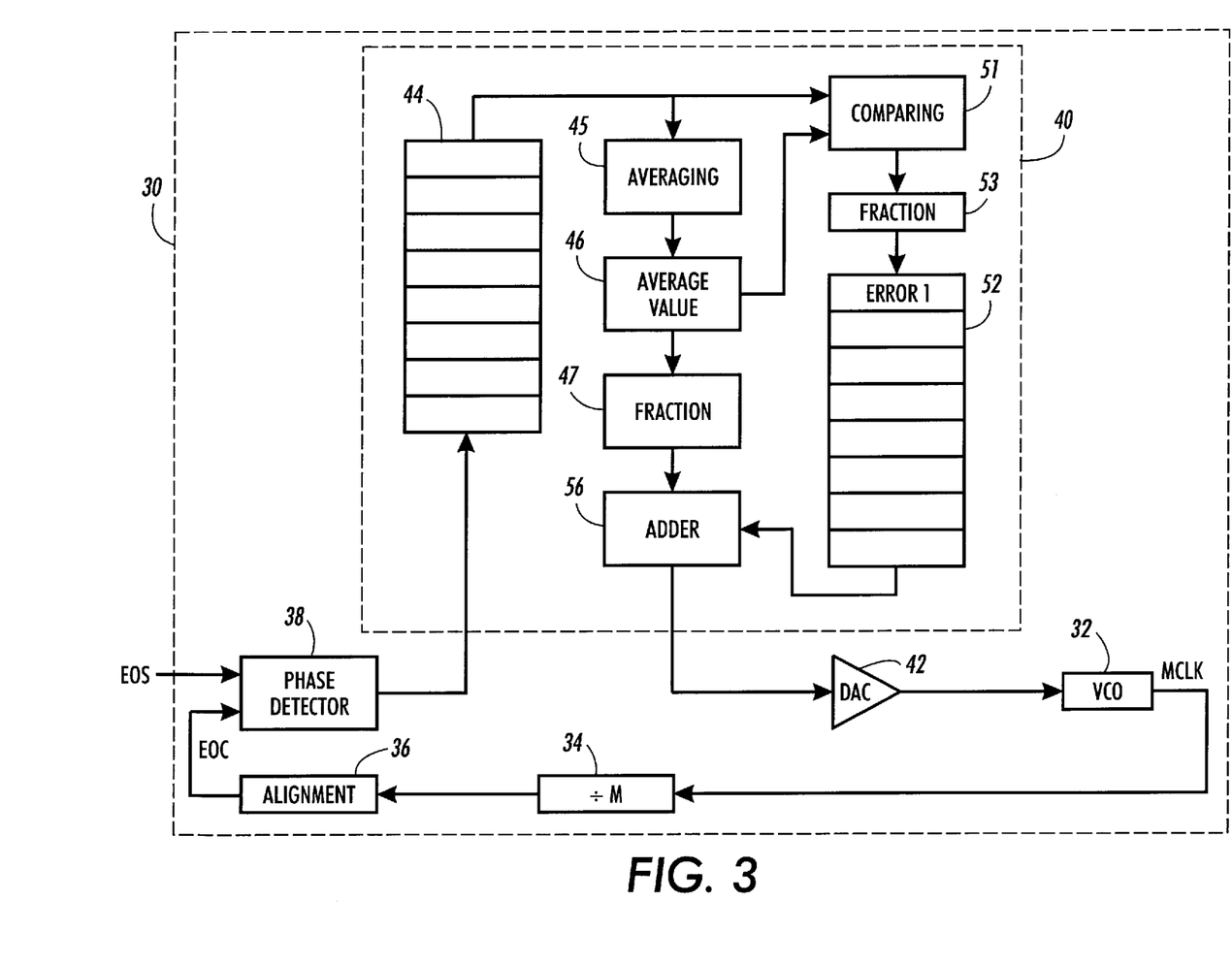
FIG. 3 shows the block diagram of FIG. 2 with an addition of facet to facet error correction.

It should be noted that, in FIGS. 2 and 3, blocks 44, 45, 46, 47, 51, 52, 53, and 56 shown within the microprocessor 40, are not the actual blocks of the microprocessor 40. They only depict the functions that microprocessor 40 performs and if one desires, microprocessor 40 can be replaced by electronic blocks which can perform the same functions as those of the blocks 44, 45, 46, 47, 51, 52, 53, and 56. It should further be noted that, in this specification, the word "microprocessor 40" and each one of the words "blocks 45, 47, 51, 53, and 56" are used interchangeably.

Microprocessor 40 or the averaging block 45 adds the time difference of all the facets of the polygon and divides the total by the number of facets to generate an average time value. The average time value will be stored in the average value block 46. Since the values of the lookup table 44 are refreshed at every rotation of the polygon, microprocessor 40 can be programmed to either recalculate the average time at the end of each polygon rotation or continuously recalculate the average time as the values in the lookup table 44 change.

The calculated average time value is used to correct the reference frequency error. In operation, if EOC arrives to the phase detector 38 before or after the EOS, this indicates that the Mclk is too fast or too slow respectively. Based on the same logic, if the average time has a positive value, it means that during the respective rotation of the polygon, Mclk has been fast for the majority of facets and if the average time has a negative value, it means that during the respective rotation of the polygon, Mclk has been slow for the majority of facets. Therefore, if the average time difference is positive, then the reference frequency needs to be decreased. If the average time difference is negative, the reference frequency needs to be increased.

The average time value is sent to a fraction block 47 which generates a correction value based on the average time value. The correction value from the fraction block 47 is sent to the VCO 32 through the DAC 42 which converts the digital signal to an analog signal before delivering it to the VCO 42. The output voltage of DAC controls the frequency of VCO 42 and causes the VCO 42 to increase or decrease the frequency of Mclk depending on if the digital correction value from the microprocessor 40 was higher or lower than previous value. Since microprocessor 40 can continuously recalculate the average time, the frequency of the main clock can be continuously adjusted. This allows the reference clock to follow a changing polygon speed as may sometimes be required during printer calibration.

Depending on the system requirements, the reference frequency adjustment can be performed in one step or in several steps. If it is desired to correct all of the reference frequency error in a single step, the fraction block 47 will be programmed to send out the entire value of the average time as a correction value. However, if it is desired to gradually correct the reference frequency error, then the fraction block 47 will be programmed to send out a given fraction of the average time value as the correction value. Of course, the given fraction can be programmed to have any desired value.

It should be noted that an alternative way to use a fraction of the average time value is to place fraction block 47 before the lookup table 44 to store a fraction of the time difference of each facet and then generate an average value from the stored values.

At the power up, microprocessor 40 sends out a value to the DAC 42 to cause the VCO 32 to start generating the Mclk. Initially, the frequency of Mclk might be too fast or too slow. However, the continuous time values sent from the phase detector 38 cause the microprocessor 40 to adjust the frequency of the Mclk and substantially reduce the reference frequency error.

Referring to FIG. 3, there is shown the block diagram of FIG. 2 with an addition of facet to facet error correction. In FIG. 3, all the elements that are the same and serve the same purpose as the elements of FIG. 2 are designated by the same reference numerals.

Microprocessor 40 or comparing block 51 calculates the difference between the time difference of each facet and the average time to generate an error for each facet. The errors are sent to a lookup table 52 through a fraction block 53 to be stored in individually addressable locations of the lookup table 52. After each rotation of the polygon, microprocessor 40 recalculates these errors, adds or subtracts the newly calculated errors to/from the values in the lookup table 52 depending on if the newly calculated error is more or less than the previous error respectively and stores the result (adjusted error value) in the lookup table 52.

Fraction block 53 can be programmed to store the entire value or a fraction of the error value in the lookup table 52. The fraction block provides the option of applying the entire error value to correct the facet to facet error in one step or use a fraction of the error to gradually correct the facet to facet error.

For each facet, microprocessor 40 will select the respective adjusted error value from the lookup table 52 and sends it to the DAC 42 through the adder 56. Adder 56 receives the error and the average time value and adds them to generate and send a correction value to DAC 42.

When the facet errors are filly corrected, then the values from the phase detector 38 will only indicate reference frequency errors. Therefore, after the system has obtained a stable profile of the facet error, the comparing block 51 can be stopped to keep the error values of the lookup table 52 fixed in order to freeze the facet to facet correction at its optimum value.

Figure 4:
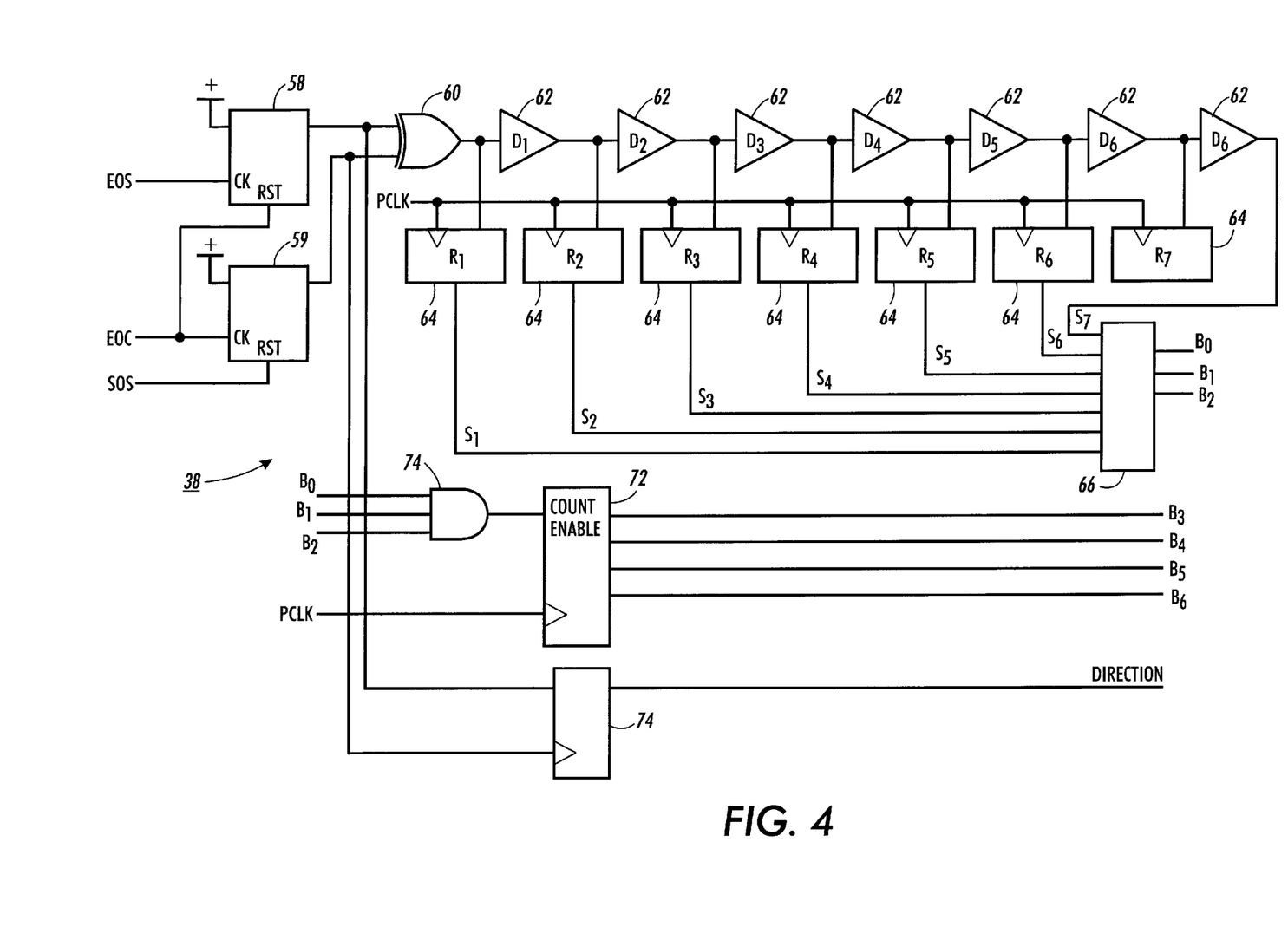
FIG. 4 shows the detailed block diagram of the phase detector block of FIGS. 2 and 3.
Figure 5:
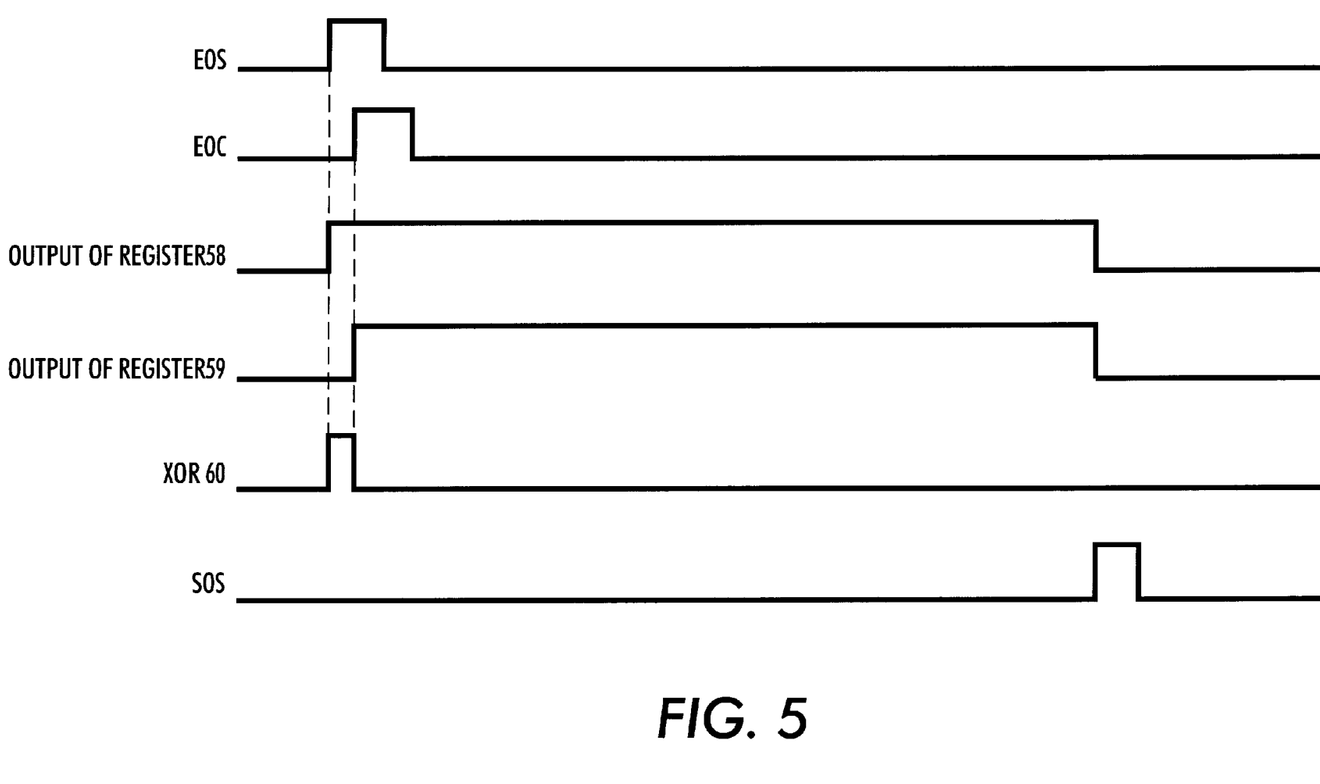
FIG. 5 shows the timing diagram of the different signals in the phase detector block of FIG. 4.

Referring to FIG. 4, there is shown the detailed block diagram of the phase detector block 38 of FIGS. 2 and 3. The phase detector 38 receives the EOS, SOS, EOC signals, and the pixel clock (PCK). Referring to both FIG. 4 and 5, the EOS and EOC signals are connected to the clock pins of registers 58 and 59 respectively. When EOS and EOC arrive, the output of the registers 58 and 59 become high (1) respectively and stay high (1) until the next start of scan (SOS) which resets both registers.

The outputs of the registers 58 and 59 are connected to XOR (Exclusive OR) 60 and the output of the XOR 60 is connected to a chain of delay elements 62 (D1, D2, D3, D4, D5, and D6). The delay elements 62 are designed with basic digital elements such as an AND gate and each one can be designed to have a given delay such as 2 nsec. The output of each delay element 62 shows the state of the signal as the signal propagates through the respective delay element The output of the XOR 60 and the output of each delay element 60 are individually connected to an input of a register 64 ($R_1$, $R_2$, $R_3$, $R_4$, $R_5$, $R_6$, and $R_7$). Registers 64 are clocked by the pixel clock Pclk (Mclk synchronized with SOS). The outputs of the registers 64 are connected to a numerical block 66.

Figure 6:
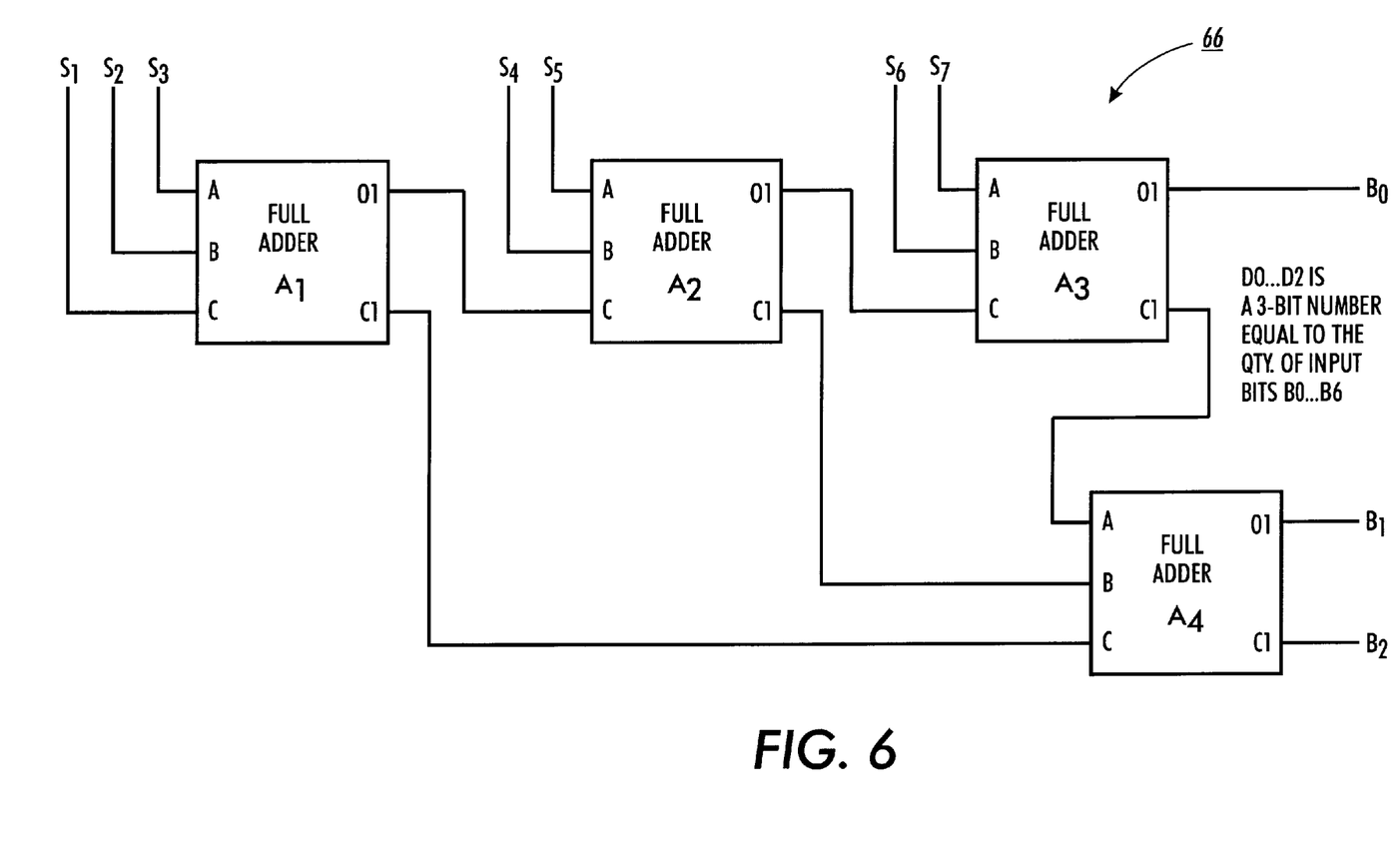
FIG. 6 shows a detailed block diagram of the numerical block of FIG. 4.

Referring to FIG. 6, there is shown a detailed block diagram of the numerical block 66. Referring to both FIGS. 4 and 5, the output of XOR 60 is high (1) when the two signals EOS and EOC are at different states from each other. Therefore, every time either EOS or EOC arrives, the output of the respective register 58 or 59 becomes (1) which causes the output of XOR 60 become (1). The output of the XOR 60 stays in that state until the other signal arrives at its respective latch and causes the output of the respective latch to become (1), in which case, the output of XOR 60 becomes (0). The duration of the high state (1) of the output of the XOR determines the delay between the arrival times of the EOS and EOC which ever happens first. The output of the XOR 60 propagates through the delay elements 62 and the duration of the high state (1) of the output of the XOR can be determined by the number of high (1) outputs of the delay elements 62.

Once a pixel clock Pclk reaches the registers 64, they register the output states of the XOR 60 and the delay elements 62. All the registered states are sent to the numerical block 66 which determines how many registered states are high, and sends out a numerical value.

Referring to FIG. 6, there is shown a detailed block diagram of the numerical block 66. Block 66 comprises a plurality of full adders $A_1$, $A_2$, and $A_3$ with each having three inputs. The inputs of adder $A_1$ are connected to the outputs $S_1$, $S_2$, and $S_3$ of the registers $R_1$, $R_2$, and $R_3$ respectively. The outputs of adders $A_1$ and $A_2$ are connected to one of the inputs of the adders $A_2$ and $A_3$ respectively. The remaining inputs of the adders $A_2$ and $A_3$ are connected to the outputs $S_4$, $S_5$, $S_6$, and $S_7$ of the registers $R_4$, $R_5$, $R_6$, and $R_7$ respectively. The carry from adders $A_1$, $A_2$, and $A_3$ are connected to the inputs of the adder $A_4$. The output of adder $A_3$ is taken as the least significant bit $B_0$, the output of adder $A_4$ is taken as the second least significant bit $B_1$, and the carry from the adder $A_4$ is taken as the third least significant bit $B_2$.

It should be noted that the number of delay elements 62 and the number of adders $A_1$–$A_3$ may be modified to accommodate a shorter or longer duration of time. Also, the delay of each element 62 may be increased or decreased to allow greater or less precision in the measurement. In this embodiment, the number of delay elements 62 are selected to cover a time period equal to the main clock period which is equal to the pixel clock period.

Referring back to FIG. 4, if the time delay between the EOS and EOC is more than one pixel clock period, then the counter 72 will be activated to measure the duration of the time difference between the EOS and EOC pulses.

A value of 111 at the output of the numerical block 66 indicates that the output of the XOR 60 has become high, but has not yet become low. This indicates that the time difference is longer than one pixel clock. Therefore, the outputs of block 66 are sent to an AND gate 74 which is connected to the count enable pin of the counter 72 which is clocked by the pixel clock Pclk Once all the outputs $B_0$, $B_1$, and $B_2$ become high, counter 72 will be enable. As soon as the second signal arrives to XOR 60, then its output becomes low and the outputs of the numerical block 66 change which disable the counter 72.

When counter 72 receives a signal at the count enable pin, it sends out count one since the delay elements 62 have covered one clock period. Counter 72 counts the number of the pixel clocks before the output of XOR 60 becomes low. As long as the output of the XOR 60 stays high (1), counter 72 keeps adding to the count at the arrival of every pixel clock. Therefore the output of the counter 72 shows the portion of the time difference between EOC and EOS that is a multiple of the pixel clock period. If the remaining duration of the time between EOS and EOC is less than a pixel clock period, the numerical block 66 will determine the remaining duration of the time.

Once the output of the XOR 60 becomes low (0), zero will propagate through the delays. However, at the arrival of the next pixel clock, the number of delay elements that are still showing high (1) determine the remaining duration of the time difference between EOS and EOC. Since, after the output of the XOR becomes low, the number shown by the numerical value block 66 changes, the counter 72 will be disabled. Therefore, at the next pixel clock after the arrival of second signal (either EOS or EOC), the output of the counter 72 shows the portion of time difference that is a multiple of pixel clock period and the output of the numerical block shows the portion of the time that is less than a pixel clock period. The outputs of the counter 72 are used as the most significant bits $B_6$, $B_5$, $B_4$ and $B_3$ to the bits $B_2$, $B_1$, and $B_0$ of the numerical block 66. Therefore, $B_6$–$B_0$ provide a numerical value for the time difference between EOS and EOC.

In FIG. 4, register 74 determines if the EOS or EOC arrives first. EOS is connected to the input and EOC is connected to the clock of register 74. When EOC arrives, register 74 registers the state of EOS. By the time EOC reaches register 74, if EOS is ahead of EOC then, EOS is high and therefore register 74 sends out a high (1). However, by the time EOC reaches register 74, if EOS is behind EOC then, EOS is low (0) and therefore register 74 sends out a low (0).

It should be noted that the disclosed embodiment of this invention can use the main clock Mclk to clock the registers 64 and counter 72 instead of the pixel clock. However, the same clock has to be used for all the registers 64 and the counter 72.

It should further be noted that numerous changes in details of construction, combination, and arrangement of elements may be resorted to without departing from the true spirit and scope of the invention as hereinafter claimed.

What is claimed is:

1. A digital delay determining apparatus comprising:
   a comparing means for receiving a first and a second signal and generating an output signal with a duration based on the time difference between the arrival time of the first and second signals;
   a delaying means having a plurality of delay stages for covering duration of a given time;
   said delaying means being electrically connected to said comparing means for receiving the output signal from said comparing means and passing it through its plurality of delay stages;
   a first delay determining means being electrically connected to said delaying means for determining the number of delay stages that cover the duration of the output signal from said comparing means if the duration of the output signal is less than the given time;
   a second delay determining means being electrically connected to and activated by said first delay determining means if the duration of the output signal from said comparing means is more than the given time; and
   said first and said second delay determining means being so constructed and arranged that said second delay determining means determines duration of a portion of the output signal from said comparing means that is a multiple of the given time and said first delay determining means determines the remaining of the duration of the output signal from said comparing means that is less than the given time.

2. The digital delay determining apparatus recited in claim 1, wherein each of said plurality of delay stages being a delay element.

3. The digital delay determining apparatus recited in claim 1 further comprises means to determine which one of the first or the second signal arrived first.

4. A digital phase detector comprising:

a comparing means for receiving a first and a second signal and comparing their arrival times;

said comparing means generating an output signal of a first state when the first signal and the second signal have the same state and generating a second state when the first signal and the second signal are at different states;

a plurality of delay elements being serially connected to each other;

said comparing means being electrically connected to the first one of said plurality of serially connected delay elements;

the output signal from said comparing means being propagated through said plurality of serially connected delay elements;

each of said plurality of delay elements having an output state which shows the state of said output signal from said comparing means as it propagates through said respective delay element;

capturing means being connected to said comparing means and said plurality of serially connected delay elements for capturing the output states of said comparing means and said plurality of serially connected delay elements at a given time; and delay determining means being connected to said capturing means for determining the number of the output states from said plurality of serially connected delay elements that show the second state of the output signal from said comparing means.

5. A digital phase detector comprising:

a comparing means for receiving a first and a second signal and comparing their arrival times;

said comparing means generating an output signal of a first state when the first signal and the second signal have the same state and generating a second state when the first signal and the second signal are at different states;

a plurality of delay elements being serially connected to each other for covering duration of a given time;

said comparing means being electrically connected to the first one of said plurality of serially connected delay elements;

the output signal from said comparing means being propagated through said plurality of serially connected delay elements;

each of said plurality of delay elements having an output state which shows the state of the output signal from said comparing means as it propagates through said respective delay element;

capturing means being connected to said comparing means and said plurality of serially connected delay elements for capturing the output states of said comparing means and said plurality of serially connected delay elements at a given time;

delay determining means being connected to said capturing means for determining the number of the output states from said plurality of serially connected delay elements that show the second state of the output signal from said comparing means;

a counter being connected to and activated by said delay determining means if the duration of the output signal from said comparing means is more than the given time;

said counter being clocked by a clock with a period equal to the given time; and said counter and said delay determining means being so constructed and arranged that said counter counts the number of clock periods that cover the duration of a portion of the output signal from said comparing means that is a multiple of the clock period and said delay determining means determines the remaining of the duration of the output signal from said comparing means that is less than one clock period.

* * * * *